United States Patent
Somayajula

(10) Patent No.: US 6,542,024 B1
(45) Date of Patent: Apr. 1, 2003

(54) CIRCUITS AND METHODS FOR CONTROLLING TRANSIENTS DURING AUDIO DEVICE POWER-DOWN, AND SYSTEMS USING THE SAME

(75) Inventor: Shyam S Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/047,346

(22) Filed: Jan. 14, 2002

(51) Int. Cl.[7] .................................................. G05F 1/10
(52) U.S. Cl. ........................ 327/535; 327/534; 327/537
(58) Field of Search ................................ 327/534, 535, 327/537, 143, 198, 111, 112, 310, 312, 379, 384, 391, 389; 326/26, 27

(56) References Cited

U.S. PATENT DOCUMENTS

| | | | | |
|---|---|---|---|---|
| 4,307,333 A | * | 12/1981 | Hargrove | 327/535 |
| 6,104,234 A | * | 8/2000 | Shin et al. | 327/534 |
| 6,194,948 B1 | * | 2/2001 | Scian et al. | 326/27 |
| 6,271,714 B1 | * | 8/2001 | Shin | 327/535 |

* cited by examiner

Primary Examiner—Toan Tran
(74) Attorney, Agent, or Firm—James J. Murphy, Esq.; Winstead Sechrest & Minick

(57) ABSTRACT

A driver circuit 605 including a p-channel transistor 606 for driving an output from a supply rail at a positive supply voltage, p-channel transistor 606 disposed in an n-well. A detector 500 detects ramp down of the supply voltage below a preselected threshold voltage while a power reservoir 301 maintains a preselected well voltage of the n-well after the supply voltage ramps down below the preselected threshold.

19 Claims, 2 Drawing Sheets

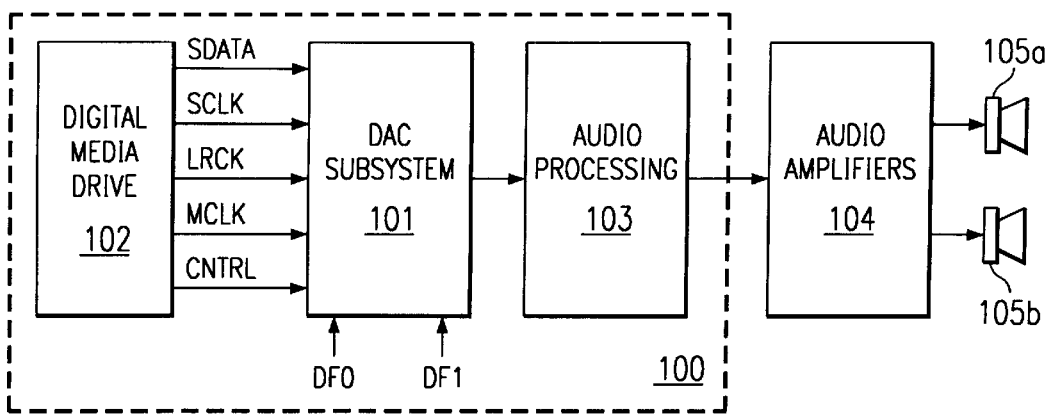
FIG. 1
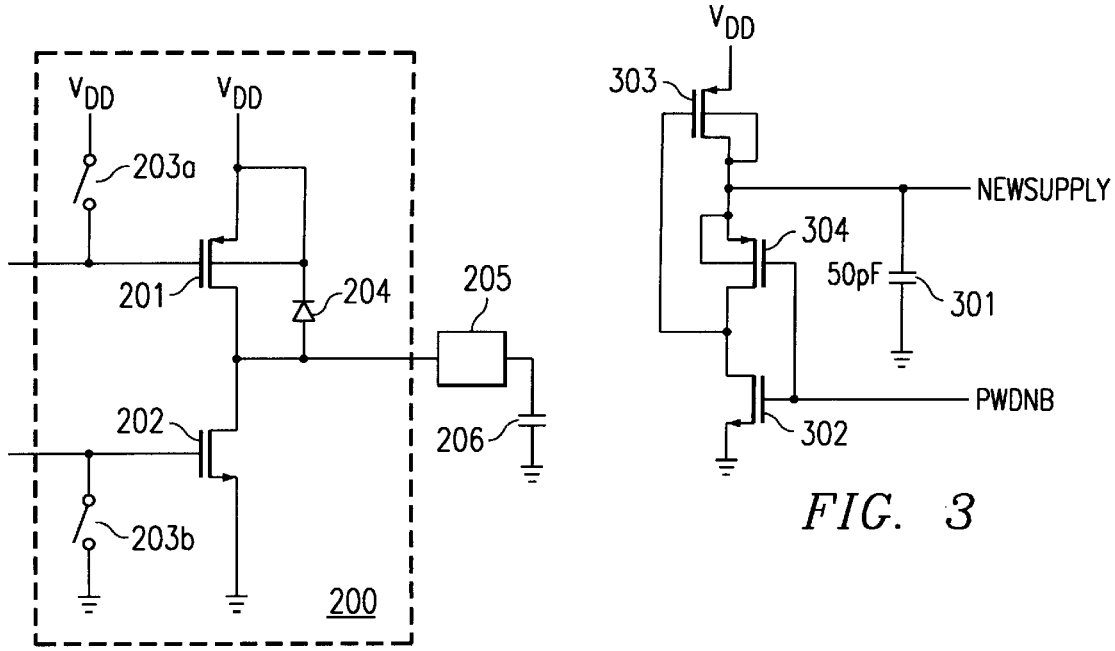
FIG. 2
FIG. 3
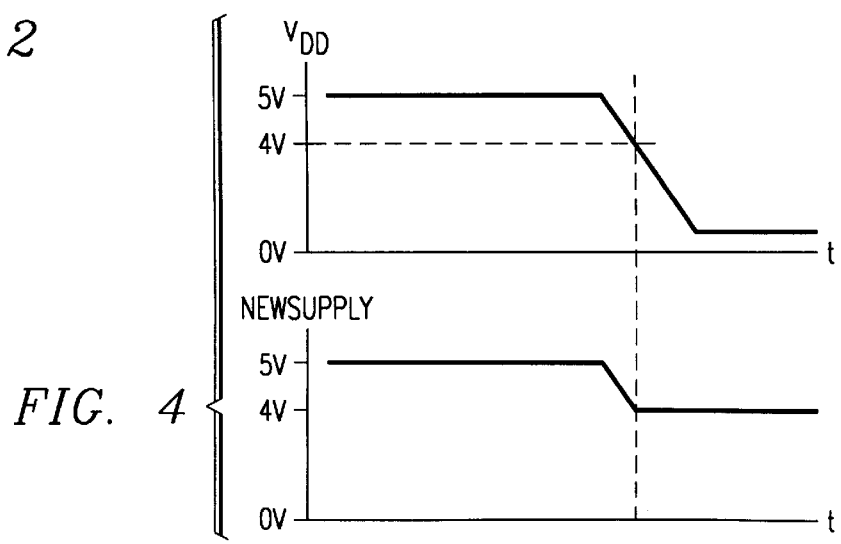
FIG. 4

CIRCUITS AND METHODS FOR CONTROLLING TRANSIENTS DURING AUDIO DEVICE POWER-DOWN, AND SYSTEMS USING THE SAME

BACKGROUND OF THE INVENTION

1. Field of the Invention

The present invention relates in general to electronic circuits and in particular to circuits and methods for controlling transients during audio device power-down, and systems using the same.

2. Description of the Related Art

Purchasers of state of the art home and portable audio systems expect improved audio performance, as well as more options for controlling playback from the given recording media. One of the most important performance criteria is the elimination of clicks, pops, noise and other artifacts audible to the user. Not only are these audible artifacts distracting to the listener, but they can also damage the system speakers or headset. This is especially true with transient artifacts, such as clicks and pops, which may spike the output signal driving the speakers or headset to a relatively high level.

Clicks and pops can be caused by a number of different conditions, such as device power-down or power-up, steps in the output signal under digital volume control, and similar situations where the output signal voltage transitions at a high rate. While there are presently a number of different of techniques for controlling clicks pops, these techniques adversely impact other aspects of system performance. Consequently, new circuits and methods are needed which control clicks, pops without significantly impacting other aspects of system performance.

SUMMARY OF THE INVENTION

The principles of the present invention are embodied in circuits and methods for driving an output load which do not generate transients if the power supply to the driver is interrupted. According to one embodiment, a driver circuit is disclosed which includes a p-channel transistor for driving an output from a supply rail at a positive supply voltage, the p-channel transistor disposed in an n-well. A detector detects ramp down of the supply voltage below a preselected threshold voltage and a power reservoir maintains a preselected well voltage of the n-well after the supply voltage ramps down below the preselected threshold.

By maintaining the well voltage for at least the p-channel transistors in the output driver, potential leakage paths between the output load and the power supply rail on power down are cut-off. Specifically, the n-wells, in which the p-channel transistors are fabricated, are kept at a voltage sufficient to ensure that the source to n-well and drain to n-well diodes of those transistors are reverse biased.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a diagram of a typical audio system such, as a portable compact disk player, according to the principles of the present invention;

FIG. 2 is an electrical schematic diagram of an output driver with switches to disable the circuit on power-down;

FIG. 3 is an electrical schematic diagram of a circuit for holding-up n-well voltages on supply voltage interruption according to the inventive principles;

FIG. 4 are voltage versus time graphs illustrating the relationship between the device power supply voltage and n-well hold-up voltage;

DESCRIPTION OF THE PREFERRED EMBODIMENTS

Figure 5:
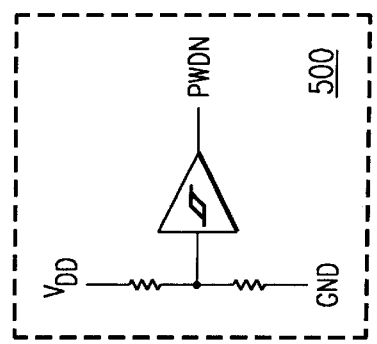
FIG. 5 is an electrical schematic diagram of an exemplary circuit for detecting supply voltage interruption.
Figure 6:
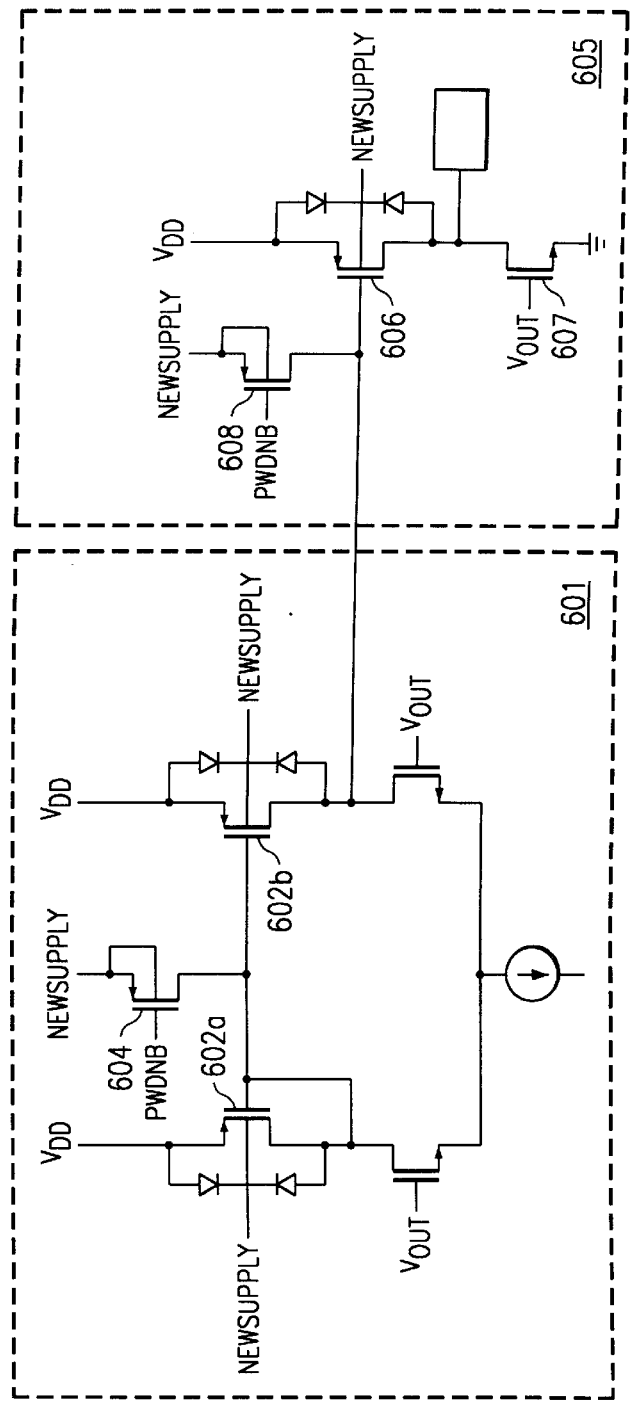
FIG. 6 is an electrical schematic diagram of an exemplary output driver embodying the anti-pop concepts of the present invention.

The principles of the present invention and their advantages are best understood by referring to the illustrated embodiment depicted in FIGS. 1–6 of the drawings, in which like numbers designate like parts.

FIG. 1 is a diagram of a typical audio system 100, such as a portable compact disk player, according to the principles of the present invention. A digital media drive 102 recovers the digital data, such as 1-bit or multi-bit encoded audio, from the storage media and passes those data, along with clocks and control signals, to DAC subsystem 101. The storage media could be a fixed media, such as a compact disk (CD) or a read/write memory such as RAM or Flash memory storing audio storing MPEG3 formatted audio. The resulting analog (audio) data undergoes further processing in circuit block 103 prior to amplification in amplifier block 104. Amplifier block 104 then drives a set of conventional speakers 105, a headset or the like. Audio processing circuits of block 103 and DAC can be integrated into a single integrated circuit or may comprise a plurality of integrated circuits.

One of conditions under which audible pops can be generated is a rapid transition in the amplifier power supply voltage $V_{DD}$ during normal operation. This may occur for example when power to the amplifier is interrupted, for whatever reason, resulting in a ramp-down of $V_{DD}$ on the order of nanoseconds. When such a rapid transition occurs, the capacitance at the amplifier output, which is typically on the order of microfarads, can discharge back through the amplifier output driver causing the audible pop.

Ideally, transitions of $V_{DD}$ below a threshold could be detected and the amplifier output driver disabled. This is illustrated by the output driver 200 FIG. 2, where the gate of p-channel transistor 201 is pulled to $V_{DD}$ and the gate of n-channel transistor 202 is pulled to ground by switches 203a and 203b respectively to disable the circuit on power-down. However, in an actual implementation, power-down glitches will still occur. Specifically, the well of p-channel transistor 201 will typically be tied to the highest voltage in the circuit, in this case $V_{DD}$. The creates the diode path shown at 204, which becomes forward-biased when $V_{DD}$ goes below a given threshold. Thus, notwithstanding the fact that switches 203a,b have disabled the driver inputs, the charge on the output capacitance 306 on pad 305 will discharge through this diode path causing a glitch.

The principles of the present invention are directed at preventing leak paths, such as diode path 204, and thereby prevent glitches when a rapid drop in $V_{DD}$ occurs.

One embodiment of the present inventive principles is output driver 300 shown in FIG. 3.

In driver circuit 300, an on-chip power reservoir, in this example a 50 pF capacitor 301 is tied to all n-wells of the p-channel transistors of the driver circuit, described in further detail below. Power reservoir 401 is charged to the voltage NEWSUPPLY after the power supply $V_{DD}$ voltage ramps down to a preselected threshold. This process is illustrated in FIG. 4, where the triggering threshold and steady-state value of NEWSUPPLY are assumed to be 4V in a 5V $V_{DD}$ system. (The triggering threshold, the power supply voltage $V_{DD}$ and/or the steady state value NEWSUPPLY may change from embodiment to embodiment, although the basic concept will essentially remain the same.) For example, when working with 3V and 1.8V systems, the threshold and NEWSUPPLY voltages will be scaled accordingly.

During normal circuit operation, the control signal PWDNB is at approximately $V_{DD}$ such that n-channel transistor 302 fully turns-on. (The control signal can be generated by glitch detector 500 shown in FIG. 5, for example.) Transistor 302 pulls down the ate of p-channel transistor 303 thereby by turning-on transistor 303 hard. Consequently, power reservoir 301 is charged to approximately the rail, $V_{DD}$. Power reservoir 301 in turn maintains the n-wells of p-channel transistors 303 and 304 at approximately $V_{DD}$. Since the p-well of transistor 303 is tied solidly to approximately $V_{DD}$, its impedance is signal independent. This allows transistor 303 to be very large to minimize its turned-on resistance $R_{ON}$ to address latch-up considerations.

When the power supply is interrupted and $V_{DD}$ transitions below the threshold voltage $V_{DD}$, here 4V, glitch detector circuit 500 causes PWDNB to transition to a logic low state. As a result, p-channel transistor 303 turns off and p-channel transistor 304 turns on. N-channel transistor 302 also turns off. In this case, NEWSUPPLY is maintained at approximately the threshold voltage, in this case approximately 4V, by power reservoir 301. Since NEWSUPPLY is tied to the n-wells of all the p-channel transistors in the driver circuit, the p-channel transistor drain to well and source to well diodes are reverse biased thereby cutting off the leakage paths discussed above. This is illustrated in the exemplary driver circuit 600 of FIG. 6, where the drain to n-well and source to n-well decodes are explicitly shown for discussion purposes.

Driver 600 includes a differential amplifier 601, comprising a pair of p-channel transistors 602a,b and a pair of n-channel transistors 603a,b, and driven by the differential output signals Vout+ and Vout−. The n-wells in which p-channel transistors 602a,b are fabricated are tied to NEWSUPPLY. An additional p-channel transistor 604 selectively couples the gates of transistors 602a,b to NEWSUPPLY in response to the state of PWDNB.

The output of differential amplifier 601 drives an inverter 605, comprising a p-channel transistor 606 and an n-channel transistor 607. As was done with p-channel transistors 602a,b, the n-well in which p-channel transistor 606 is fabricated is tied to NEWSUPPLY. P-channel transistor couples the gate of transistor 606 to NEWSUPPLY in response to the state of PWDNB. Inverter 605 drives the output pad 607.

When $V_{DD}$ is interrupted or otherwise goes below the threshold voltage, transitions PWDNB to an active low state and NEWSUPPLY holds-up the voltage at the n-wells of p-channel transistors 602a,b and 606. Consequently, the source to n-well and drain to n-well diode of transistors 602a,b and transistor 606. At the same time, transistors 604 and 608 pull the gates of p-channel transistors 602a,b and 606 to NEWSUPPLY thereby insuring that these transistors are turned-off. As a result, all the leakage pathways are cutoff eliminating a fast discharge of the output capacitance and clicks and pops in the audio output.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A driver circuit comprising:
   a p-channel transistor for driving an output from a supply rail at a positive supply voltage, the p-channel transistor disposed in an n-well;
   a detector for detecting ramp-down of said supply voltage below a preselected threshold voltage; and
   a power reservoir for maintaining a preselected well voltage of the n-well after said supply voltage ramps down below the preselected threshold voltage.

2. The driver circuit of claim 1 wherein the power reservoir comprises a capacitor.

3. The driver circuit of claim 2 and further comprising circuitry for charging the power reservoir comprising:
   a first p-channel transistor having a source coupled to the supply rail and a drain coupled to the capacitor and disposed in an n-well coupled to the capacitor;
   a second p-channel transistor having a source coupled to the capacitor and the drain of the first p-channel transistor, a drain coupled to a gate of the first p-channel transistor and disposed in an n-well coupled to the capacitor; and
   an n-channel transistor having a drain coupled to a drain of the second p-channel transistor and a gate coupled to a gate of the second p-channel transistor and an output of the detector.

4. The driver circuit of claim 1 and further comprising a transistor for selectively pulling a gate of the p-channel transistor to the preselected well voltage after the supply voltage ramps down below the preselected ramp down voltage.

5. The driver circuit of claim 1 wherein the preselected well voltage is preselected to maintain a selected one of an n-well to source diode and an n-well drain-n-well paths of the p-channel transistor in an off-state when the supply voltage ramps down below the preselected threshold voltage.

6. The driver circuit of claim 1 wherein the detector comprises a voltage divider and a buffer with hysteresis having an input coupled to said voltage divider.

7. A driver comprising:
   a transistor disposed in a well for driving a node from a voltage rail;
   a capacitor for maintaining a preselected voltage on said well when said voltage rail varies by a predetermined amount, said preselected voltage selected to maintain a diode between said well and a selected one of source and drain nodes of said transistor in a reverse biased state; and circuitry for charging said capacitor comprising:

a first p-channel transistor having a source coupled to said voltage rail, a drain coupled to said capacitor, and disposed in an n-well coupled to said capacitor;

a second p-channel transistor having a source coupled to said capacitor and said drain of said first p-channel transistor, a drain coupled to a gate of said first p-channel transistor, and disposed in an n-well coupled to said capacitor; and an n-channel transistor having a drain coupled to a drain of the second p-channel transistor, a gate coupled to a gate of said second p-channel transistor, the gates of said second p-channel and n-channel transistors controlled by a control signal.

8. The driver of claim 7 wherein said transistor comprises a p-channel transistor disposed in an n-well and having a source coupled to said voltage rail and a drain coupled to said node.

9. The driver of claim 7 wherein said control signal transitions from a first state to a second state when said voltage rail varies by the predetermined amount.

10. The driver of claim 7 and further comprising a second transistor for selectively maintaining a gate of said transistor at said preselected voltage when said voltage rail varies by the predetermined amount.

11. The driver of claim 7 wherein said node comprises a pad.

12. The driver of claim 8 wherein said p-channel transistor is further coupled to an n-channel transistor to form an inverter for driving said node.

13. The driver of claim 8 wherein said p-channel transistor is further coupled to an n-channel transistor forming a portion of a differential amplifier.

14. The driver of claim 9 and further comprising a detector for causing said control signal to transition from the first to the second state when said voltage rail varies by the predetermined amount.

15. A method of controlling leakage in a driver circuit comprising a p-channel transistor for driving a node from a voltage rail, the p-channel transistor disposed in an n-well, comprising the steps of:

detecting a drop in the voltage at the voltage rail below a preselected threshold; and maintaining a preselected voltage at the n-well in response to said step of detecting to maintain a diode between a selected one of source and drain nodes of the p-channel transistor and the n-well in a reverse biased state.

16. The method of claim 15 wherein said step of maintaining a preselected voltage comprises the substeps of:

charging a capacitor coupled to the n-well prior to a drop in the voltage at the voltage rail; and maintaining the preselected voltage at the n-well with the charged capacitor.

17. The method of claim 15 wherein said step of detecting comprises the step of detecting an interruption in the voltage at the voltage rail.

18. The method of claim 15 and further comprising the step of maintaining the preselected voltage at a gate of the p-channel transistor in response to said step of detecting.

19. The method of claim 15 wherein the node comprises a pad.

* * * * *